United States Patent [19]

Endo et al.

[11] Patent Number: 5,059,859

[45] Date of Patent: Oct. 22, 1991

[54] CHARGED PARTICLE BEAM GENERATING APPARATUS OF MULTI-STAGE ACCELERATION TYPE

[75] Inventors: Junji Endo, Sakado; Takeshi Kawasaki, Yuki; Masahiro Tomita; Shigeto Isakozawa, both of Katsuta; Toshimitu Miyada, Hachioji; Yutaka Kaneko, Tokyo, all of Japan

[73] Assignee: Hitachi, Ltd., Tokyo, Japan

[21] Appl. No.: 507,798

[22] Filed: Apr. 12, 1990

[30] Foreign Application Priority Data

Apr. 14, 1989 [JP] Japan .................... 1-092841
Aug. 28, 1989 [JP] Japan .................... 1-218667

[51] Int. Cl.$^5$ ................... H01J 37/073; H01J 31/02
[52] U.S. Cl. .................... 313/443; 315/15; 315/336; 328/233; 250/396 R
[58] Field of Search ............... 328/233; 313/14, 15, 313/36, 336, 443; 250/396 R, 313

[56] References Cited

U.S. PATENT DOCUMENTS

3,823,335  7/1974  Scheffels et al. .......... 328/233
3,925,664 12/1975  Coates et al. ............. 313/336
4,721,878  1/1988  Hagiwara et al. .......... 313/336
4,945,247  2/1989  Kawasaki et al. .......... 313/443
4,980,558  7/1984  Rose et al. .............. 313/336
4,987,345  8/1985  Stormberg et al. ......... 250/396 R

*Primary Examiner*—Leo H. Boudreau
*Assistant Examiner*—Rohini Khanna
*Attorney, Agent, or Firm*—Fay, Sharpe, Beall, Fagan, Minnich & McKee

[57] ABSTRACT

A charged particle beam generating apparatus of multi-stage acceleration type includes a charged particle beam source and a multi-stage acceleration tube having a plurality of acceleration electrodes arranged in cascade over a plurality of stages within the tube. A plurality of outer shield electrodes are disposed in concentrical relation on the radially outer side of the multi-stage acceleration tube over the plural stages to be applied with the same potentials as those of the associated acceleration electrodes respectively. Finally, a plurality of dividing resistors are disposed outside of the multi-stage acceleration tube or between the outer shield electrodes and the multi-stage acceleration tube so as to apply predetermined potentials to the acceleration electrodes, respectively.

33 Claims, 8 Drawing Sheets

CHARGED PARTICLE BEAM GENERATING APPARATUS OF MULTI-STAGE ACCELERATION TYPE

BACKGROUND OF THE INVENTION

This invention relates to improvements in a charged particle beam generating apparatus of multistage acceleration type, and more particularly to an improved structure of a charged particle beam generating apparatus of multi-stage acceleration type which can operate at an acceleration voltage as high as 100 kV or more and which is suitable for use as, for example, a field emission electron gun of multi-stage acceleration type.

An example of a field emission electron gun of multi-stage acceleration type is disclosed in co-pending patent application Ser. No. 365,827 filed by the inventors on June 14, 1989.

A prior art charged particle beam generating apparatus of multi-stage acceleration type used as a field emission electron gun is described in, for example, U.S. Pat. No. 4,642,461 to Endo et al patented on Feb. 10, 1989. The disclosed electron gun includes a multi-stage acceleration tube, a plurality of acceleration electrodes arranged in cascade in the individual stages on the radially inner side of the multi-stage acceleration tube, a plurality of shield electrodes disposed in the individual stages on the radially outer side of the multi-stage acceleration tube and a plurality of dividing resistors disposed between the wall of the multi-stage acceleration tube and the shield electrodes in the individual stages for applying predetermined acceleration voltages to the respective acceleration electrodes. Both the acceleration electrodes and the shield electrodes are commonly made of a metal such as permalloy having a high permeability, so that the electric field distribution at the wall of the multi-stage acceleration tube can be made smooth and uniform thereby preventing occurrence of undesirable discharge between the acceleration stages and so that they can act as means for shielding the electron gun against an external magnetic field.

An electron gun for use in, for example, an electron microscope is required to be operable at a high voltage in view of the demand for improving the resolution. At the same time, maintainability is also required for the electron gun. Further, magnetic shielding capability is also required for the electron gun so that the path of its electron beam may not be adversely affected by an external magnetic field.

Therefore, undesirable discharge at its multistage acceleration tube must be prevented because a high voltage is applied to the acceleration electrode in each stage of the multi-stage acceleration tube. Further, the structure of the electron gun must be such as to permit easy disassembling and re-assembling of the electron gun.

With the increase in the acceleration voltage, minute discharge tends to induce occurrence of undesirably great discharge. Therefore, a more complete measure for preventing the undesirable discharge is required. Further, with the increase in the acceleration voltage, the length of the multi-stage acceleration tube must be extended in proportion to the level of the voltage. In this case, however, the magnetic shielding effect must also be improved in a relation generally proportional to the square of the length of the multi-stage acceleration tube.

In such a charged particle beam generating apparatus of multi-stage acceleration type, undesirable discharges attributable to application of a high voltage tend most frequently to occur at the joint between the cylindrical member of an electrical insulator constituting each stage of the multi-stage acceleration tube and a spacer of a metal located between the individual insulating cylindrical members so as to apply the divided acceleration voltage to each stage of the acceleration tube. The electric field strength in the area of this joint is determined by the shape of the joint and also by the shape and arrangement of the acceleration electrode and shield electrode. For the purpose of preventing occurrence of undesirable discharge, it is most important that any abrupt change should not appear in the electric field distribution so that the electric field may not be concentrated in a specific location.

In the prior art charged particle beam generating apparatus of multi-stage acceleration type in which the dividing resistors and means such as links of an electrical insulator for adjusting the position of the charged particle beam source are disposed between the wall of the multi-stage acceleration tube and the shield electrodes, the shield electrodes are spaced apart by a considerable distance from the acceleration electrodes, and the presence of the dividing resistors leads to a nonuniform potential distribution between the acceleration stages. Therefore, alleviation of undesirable concentration of the electric field in the area of each of the joints described above has had a limitation in the prior art apparatus. Also, for the same reason, the shield electrodes in the prior art apparatus have had a limited effect on shielding against the external magnetic field. Especially, with the increase in the acceleration voltage, more complete measures to deal with the high-voltage discharge and to ensure the magnetic shielding effect are required. However, the prior art apparatus have been unable to sufficiently satisfy these requirements.

In the case of disassembling or re-assembling the apparatus, the acceleration electrodes, shield electrodes and dividing resistors must be dismounted and remounted one by one.

In the conventional apparatus, the distance between the electrodes is generally selected to produce an averaged electric field of only about 5 kV per mm so as to prevent occurrence of undesirable discharge between the acceleration electrodes or between the shield electrodes. Therefore, the magnetic shielding effect in the prior art apparatus has not necessarily been sufficient. Further, in the prior art apparatus, the confronting surfaces of the electrodes are polished to a mirror finish so as to prevent occurrence of undesirable discharge. Therefore, the prior art apparatus has been disadvantageous in that a high cost is required for polishing the electrode surfaces, and such electrode surfaces tend to be easily damaged during the dismounting and re-mounting of these electrodes.

Although the dividing resistors need not necessarily be disposed near the multi-stage acceleration tube as employed in the prior art apparatus, they are required to be installed in the same insulating housing and to be connected to the respective acceleration electrodes in the multi-stage acceleration tube. However, connection of lead wires between the acceleration electrodes and the dividing resistors is complex and troublesome in the prior art apparatus, and contamination or fouling of the surface of the dividing resistors leads to occurrence of undesirable high-voltage discharge. Thus, the prior art apparatus has also been disadvantageous from the aspects of lead connectability and stability against the high-voltage discharge.

SUMMARY OF THE INVENTION

It is a first object of the present invention to improve both the discharge withstand capability and the external magnetic field shielding effect of such a charged particle beam generating apparatus of multi-stage acceleration type.

It is a second object of the present invention to provide a charged particle beam generating apparatus of multi-stage acceleration type which is improved in its maintainability together with the improvement in its discharge withstand capability.

The first object of the present invention is attained by disposing a first field electrode on the radially outer side of each stage of a multi-stage acceleration tube of a charged particle beam generating apparatus of multi-stage acceleration type, disposing a second shield electrode on the radially outer side of the first shield electrode in each stage, and disposing dividing resistors and links between the first shield electrodes and the second shield electrodes. In a case that the charged particle beam is an electron beam, since more magnetic shield effect is required, it is necessary to make the electrodes from a permeability material.

By disposing the first shield electrodes on the radially outer side of the multi-stage acceleration tube, disposing the dividing resistors on the outside of the first shield electrodes and then disposing the second shield electrodes on the outside of the dividing resistors, the electric field distribution inside and outside of the multi-stage acceleration tube can be made uniform without being disturbed by both the dividing resistors and the links. Further, the first shield electrodes can be located nearer to the acceleration electrodes, so that undesirable electric field concentration on the joints between the cylindrical member of the electrical insulator constituting each stage of the multi-stage acceleration tube and the space of the metal located between the individual insulating cylindrical members can be avoided. Therefore, both the discharged preventive effect and the magnetic shielding effect are improved.

Also, the provision of the shield electrodes in double relation improves the shielding effect against the external magnetic field.

In order to attain the second object described above in addition to attaining the first object, part or all of the electrodes, especially the outer electrodes (the shield electrodes), are molded into an integral molded block of, for example, an electrical insulator resin. When this method is applied to the electrodes disposed inside the multi-stage acceleration tube, the insulator may be charged up thereby adversely affecting the flow of the electron beam. However, in the case of the electrodes disposed outside the multi-stage acceleration tube, the frequency of mounting and dismounting those electrodes is far higher than that of the inner electrodes, and there is no possibility of adversely affecting the flow of the electron beam, so that the effectiveness of the present invention can be further enhanced.

Further, in the case where the dividing resistors are disposed near the outer electrodes, and the links are provided for adjusting the position of the charged particle beam source, the dividing resistors are preferably molded into the integral molded block together with the outer electrodes, and an axial through-hole for receiving each of the links therein is preferably formed in the insulator part of the molded block. This arrangement provides further desirable results from the point of view of preventing undesirable high voltage discharge and ensuring the maintainability.

In the prior art apparatus of this kind, electrical insulating gas such as freon gas or sulfur hexafluoride gas is charged so as to electrically insulate the outer electrodes from each other. In contrast, in the apparatus of the present invention, a solid electrical insulator, for example, an electrical insulating resin such as an epoxy resin is used to mold those electrodes. Because the epoxy resin has a dielectric strength several times as high as that of the electrical insulating gas described above, the electrode surfaces need not be polished to provide mirror surfaces, and the cost can be correspondingly reduced.

Further, by molding the plural outer electrodes or the combination of the plural outer electrodes and associated, dividing resistors into the integral molded block, the outer electrodes or the combination of the outer electrodes and the dividing resistors can be mounted and dismounted at one time, so that both the efficiency of disassembling and reassembling the apparatus and the efficiency of adjusting the apparatus can be improved.

Further, because the integral molding described above permits a decreased spacing between the outer electrodes, the magnetic field shielding effect is greatly enhanced.

DESCRIPTION OF THE PREFERRED EMBODIMENTS

A first embodiment of the charged particle beam generating apparatus of multi-stage acceleration type according to the present invention will now be described with reference to FIG. 1 which schematically shows application of the present invention to a field emission electron gun of multi-stage acceleration type.

Figure 1:
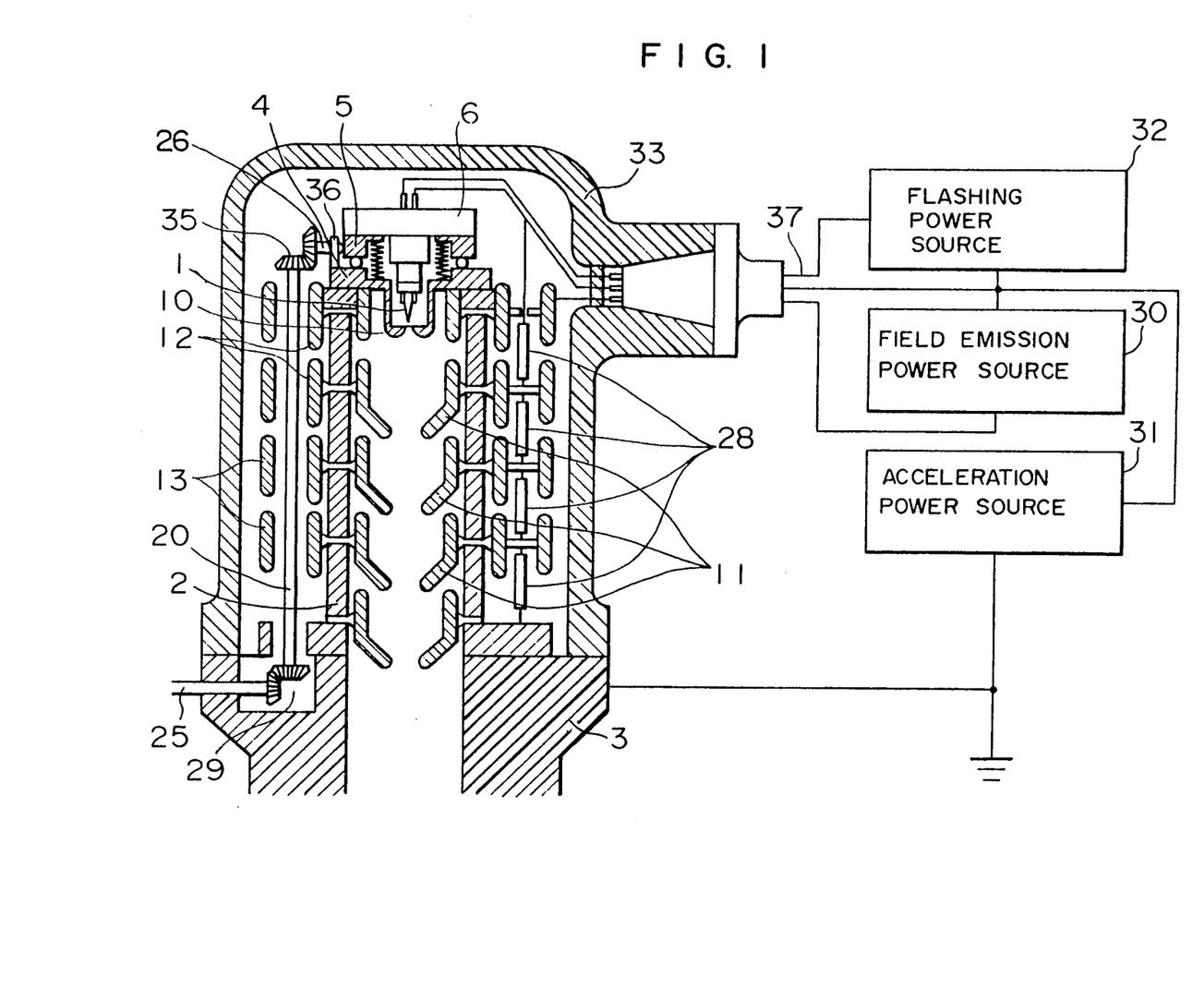
FIG. 1 schematically shows application of a first embodiment of the charged particle beam generating apparatus of multi-stage acceleration type of the present invention to a field emission type electron gun.

Referring to FIG. 1, a multi-stage acceleration tube 2 provided with flanges 4 and 6 on its upper end is mounted at its lower end on a column 3 to constitute a vacuum vessel. The interior of the multi-stage acceleration tube 2 is evacuated from the side of the column 3 by evacuating means (not shown), and gas of an electrical insulator such as freon gas is charged in the space between the multi-stage acceleration tube 2 and an electrically insulating housing 33 to provide an electrically insulating gas atmosphere. An electron beam source 1 of field emission type is mounted on the flange 6, and a field emission electrode 10 having a central aperture is located opposite to the field emission type electron beam source 1. An acceleration electrode 11 is disposed inside each stage of the multi-stage acceleration tube 2, and a first shield electrode 12 and a second shield electrode 13 are disposed outside each stage of the multi-stage acceleration tube 2. Dividing resistors 28 and link 20 is disposed between the first shield electrodes 12 and the second shield electrodes 13. The link 20 is made essentially of an electrical insulator. The high voltage is provided to the electron-gun unit by high tension cable 37.

A flashing power source 32 is connected to the field emission electron beam source 1 to supply a pulse current prior to the field emission so as to flash-heat the electron beam source 1 thereby activating the electron beam source 1. A field emission power source 30 supplies a voltage of 3 to 6 kV across the field emission electron beam source 1 and the field emission electrode 10 so as to cause field emission of an electron beam from the electron beam source 1. An acceleration voltage generated from an acceleration power source 31 is applied to the field emission electron beam source 1, and, at the same time, divided by the dividing resistors 28, the divided voltage being applied to the acceleration electrodes 11 disposed in the individual acceleration stages respectively of the multi-stage acceleration tube 2. The electron beam generated as a result of the field emission passes through the central aperture of the field emission electrode 10 and is then accelerated up to a predetermined energy level by the acceleration electrodes 11. Then, the accelerated electron beam is guided toward a specimen through an illumination system including at least a deflection coil unit (not shown) and a condenser lens (not shown).

For the purpose of horizontal alignment of the electron beam source 1, a rotation transmission or drive mechanism 25 for driving each of the links 20 is provided to rotate the link 20. In FIG. 1, only one link 20 is shown for simplicity of illustration. The rotating movement of the link 20 is converted by a fine adjustment mechanism 26 into a corresponding translational movement thereby moving a micro-movement disk 5 in a horizontal direction.

One of the links 20 acts to transmit rotating force transmitted by the combination of a drive mechanism 25 and an associated lower gearing 29 to an upper gearing 35. This upper gearing 35 transmits the rotating force to a feed screw type actuator 36, and the advancing movement of the feed screw is utilized to move micro-movement disk 5 connected to flange 4 with a bellows in one direction thereby attaining horizontal alignment of the electron beam source 1. Although not shown in FIG. 1, a horizontal alignment mechanism similar to that described above is provided on the other side of the optical axis of the electron beam source 1 in a relation substantially opposite to the feed screw type actuator 36 so as to move the electron beam source 1 in the opposite direction. Another pair of such horizontal alignment mechanisms are also provided in a relation orthogonal with respect to the former mechanism pair, so that the electron beam source 1 can be moved in any desired direction in the horizontal plane while applying a high voltage to the electron beam source 1.

According to the first embodiment of the present invention, the dividing resistors 28 and the links 20 are disposed between the first shield electrodes 12 and the second shield electrodes 13. This arrangement improves the discharge withstand capability of all of the multi-stage acceleration tube 2, dividing resistors 28 and links 20.

Figure 2:
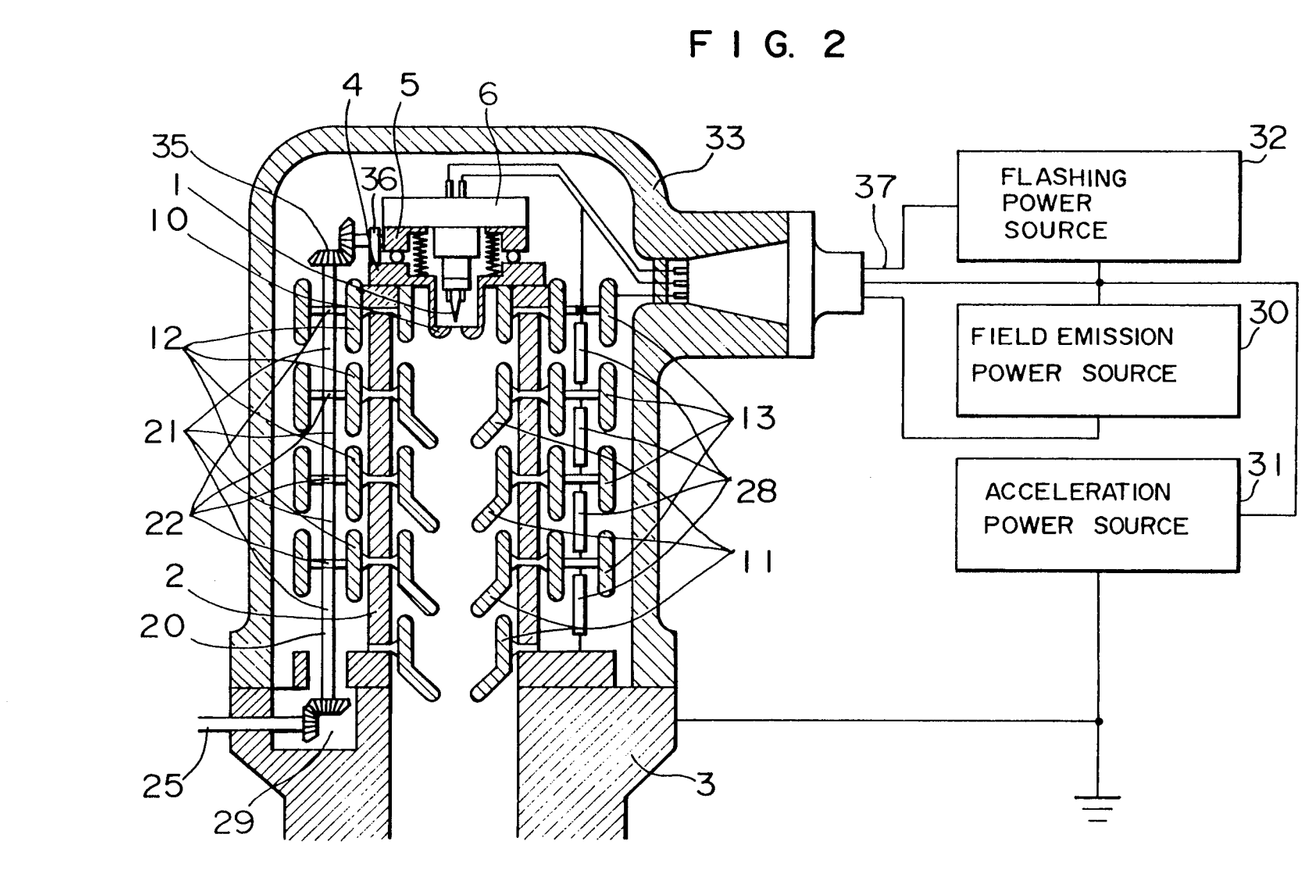
FIG. 2 schematically shows application of a second embodiment of the present invention to a field emission type electron gun.

FIG. 2 schematically shows a second embodiment of the present invention and, in FIG. 2, the same reference numerals are used to designate the same parts appearing in FIG. 1. Although this second embodiment is the same in its basic structure as the first embodiment, the second embodiment differs from the first embodiment in that each link 20 has a structure such that electrical insulator members 21 and electrical conductive metal members 22 are alternately connected in the same cycle as the cycle of division of the multi-stage acceleration tube 2. Each conductor member 22 is in electrical contact with the shield electrodes 12 and 13 in each stage. This arrangement further improves the discharge withstand capability of the links 20.

When each link 20 is in the form of a single elongated rod as shown in FIG. 1, the distribution of the electric field produced along the link 20 tends to become non-uniform. On the other hand, when each link 20 is divided according to the number of the acceleration stages, and the divided insulator members 21 of the link 20 are connected by the conductor members 22, the individual short insulator members 22 exhibit the effect similar to that of voltage division by the multi-stage acceleration tube, so that the individual electric fields have a substantially uniform distribution.

Figure 3:
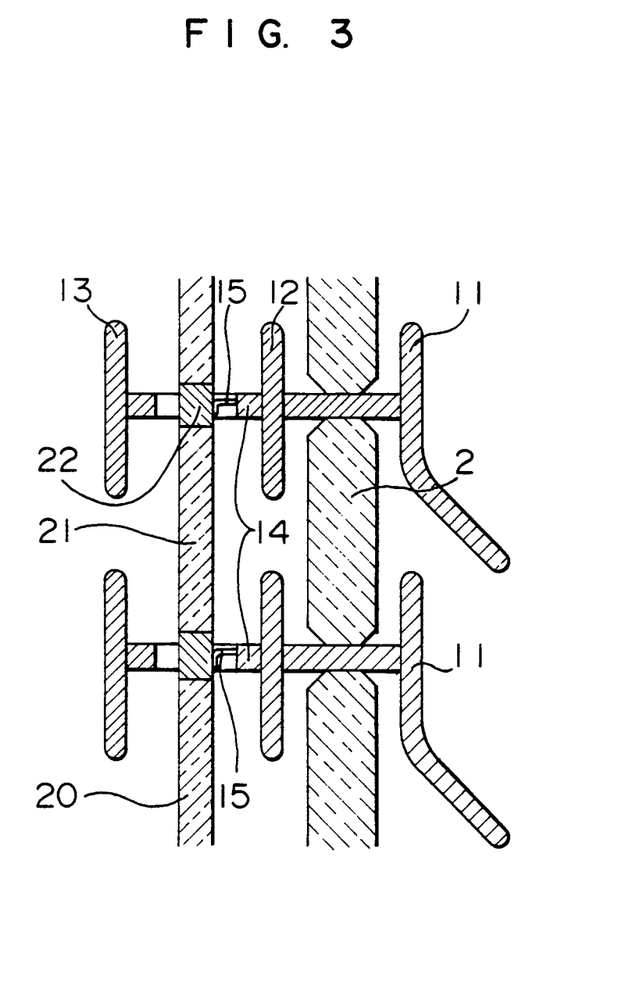
FIG. 3 is a schematic partial view showing in detail the arrangement of the outer electrodes and other parts of the electron gun shown in FIG. 2.

FIG. 3 is a schematic partial view showing in detail the arrangement of the shield electrodes and associated parts in the apparatus shown in FIG. 2. FIG. 3 shows that the link 20 is formed by alternately connecting the insulator members 21 and the conductive metal members 22. An axial through-hole permitting extension of the link 20 therethrough is bored in a connection member 14 connecting between the first shield electrode 12 and the second shield electrode 13 in each stage. The metal member 22 makes slidable electrical contact through a flexible metal terminal 15 with the first shield electrode 12 or the second shield electrode 13 so as to have the same potential as that of the shield electrode 12 or 13.

Figure 4:
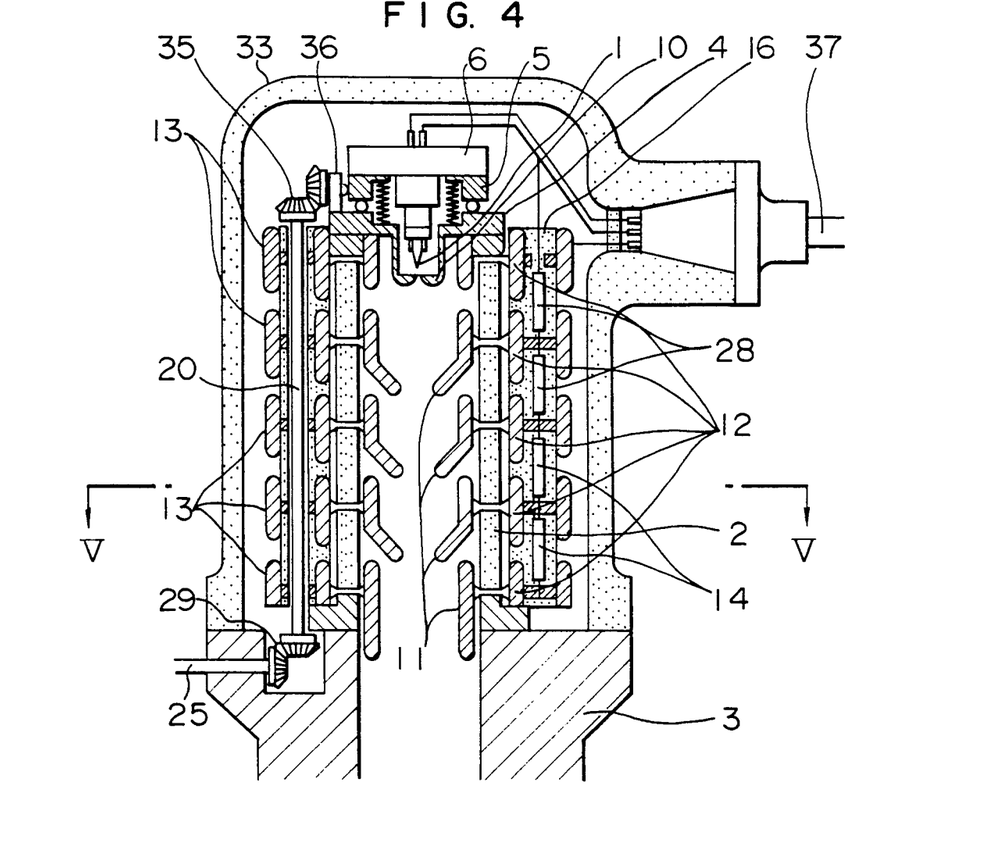
FIG. 4 schematically shows application of a third embodiment of the present invention to a field emission type electron gun.

A third embodiment of the present invention will now be described with reference to FIG. 4 which shows application of the present invention to a field emission electron gun of multi-stage acceleration type. In FIG. 4, power sources for the electron gun are not shown, and like reference numerals are used to designate like parts appearing in FIGS. 1, 2 and 3.

Referring to FIG. 4, a multi-stage acceleration tube 2 provided with flange 4 and flange 6 mounting electron beam source 1 is mounted at its lower end on a column 3 to constitute a vacuum vessel. The interior of the multi-stage acceleration tube 2 is evacuated from the side of the column 3 by evacuating means (not shown), and gas of an electrical insulator such as freon is charged in the space between the multi-stage acceleration tube 2 and an electrically insulating housing 33 to provide an electrically insulating gas atmosphere. An electron beam source 1 of field emission type is mounted on the flange 6, and a field emission electrode 10 having a central aperture is located opposite to the field emission type electron beam source 1. An acceleration electrode 11 is disposed inside each stage of the multi-stage acceleration tube 2. A first shield electrode 12 and a dividing resistor 28 dividing an acceleration voltage are disposed outside each stage of the multi-stage acceleration tube 2. All of these first shield electrodes 12 and these dividing resistors 28 are integrally molded into a molded block constituted by a mass of an electrically insulating resin such as an epoxy resin to constitute a molded electrode unit 16. Second shield electrodes 13 are disposed on the radially outer side of the molded electrode unit 16 to act as a means for preventing occurrence of creeping discharge along the wall of the molded electrode unit 16 and to act also as a magnetic shielding means. Links 20 extend through axial through-holes bored in the resin part of the molded electrode unit 16. The horizontal alignment is made in a same manner as FIG. 1. The high voltage is supplied by a high tension cable 37 into the charged particle beam generating apparatus of multi-stage acceleration type, and, in the insulating housing 33, predetermined voltages are applied to the electron beam source 1, field emission electrode 10 and dividing resistors 28 respectively. As described above, the field emission electrode 10 is disposed opposite to the electron beam source 1. The electron beam emitted from the electron beam source 1 in response to the voltage applied across the electron beam source 1 and the field emission electrode 10 passes through the central aperture of the field emission electrode 10 and is then accelerated up to a predetermined energy level by the acceleration electrodes 11.

The electron beam emitted from the electron gun of field emission type has a very small diameter which is as small as about 1/1,000 of that emitted from a conventional electron gun of thermionic emission type. Therefore, when the electron beam emitted from the electron gun of field emission type is deflected by an unnecessary a.c. magnetic field generated from an ambient apparatus, the influence of the magnetic field on the electron beam is about 1,000 times as large as that on the electron beam emitted from the conventional electron gun. Also, the electron gun of field emission type is featured by the fact that the brightness of its electron beam is about 1,000 times as high as that of the electron beam emitted from the conventional electron gun. However, when the electron beam emitted from the electron gun of field emission type is deflected by the a.c. magnetic field, its practical brightness is lowered, and the merit of the electron gun of field emission type is lost. Therefore, it is a common practice to employ a metal having a high permeability as the material of the column and electrodes so that they can exhibit the effect of magnetic shielding. Because the magnetic shielding effect is large when the magnetic circuit is closed, no substantial problem arises in the column 3. However, in the multi-stage acceleration tube 2, magnetic gaps are necessarily formed for the purpose of high voltage insulation, and the magnetic shielding effect is inevitably lowered. In the third embodiment shown in FIG. 4, the first shield electrodes 12 are molded together with the dividing resistors 28 into the integral molded block by the epoxy resin. Therefore, the spacing between the vertically adjacent first shield electrodes 12, that is, the magnetic gap, can be shortened to about $\frac{1}{3}$ of the conventional value. Thus, the magnetic shielding effect can be greatly improved.

In assembling the electron gun shown in FIG. 4, the acceleration electrodes 11 are first mounted in the multi-stage acceleration tube 2, and the multi-stage acceleration tube 2 is then mounted on the column 3 through a vacuum seal (not shown) interposed between them. Subsequently, the flange 4 and flange 6 having the electron beam source 1 set thereon are mounted on the multi-stage acceleration tube 2 through vacuum seals (not shown) interposed between them. The interior of the electron gun thus assembled is then evacuated, and, in order to establish an ultra high vacuum, the step of evacuation is continued while heating the entire electron gun up to about 300° C. After the electron gun is cooled, the ultra high vacuum is established in the electron gun. The molded electrode unit 16 is then set in position together with the second shield electrodes 13 and the horizontal alignment mechanism pairs are then mounted in position. Then, when the entire assembly is covered by the insulating housing 33, and the insulating gas is charged, the electron gun is ready to operate.

Figure 5:
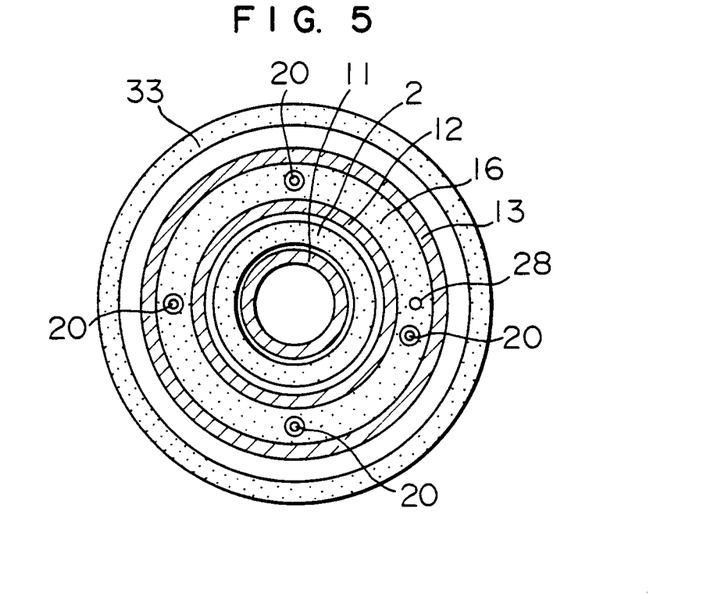
FIG. 5 is a schematic sectional view taken along the line V—V in FIG. 4.

FIG. 5 is a schematic sectional view taken along the line V—V in FIG. 4. FIG. 5 shows that the acceleration electrodes 11, the multi-stage acceleration tube 2, the first shield electrodes 12 and the second shield electrodes 13 are concentrically arranged around the center of the section. The molded electrode unit 16 formed by molding the first shield electrodes 12 and the dividing resistors 28 by the epoxy resin is assembled together with the second shield electrodes 13. The four links 20 extend through the axial through-holes bored in the resin part of the molded electrode unit 16.

The electron gun shown in FIG. 4 is disassembled when a trouble of some kind has occurred. A most probable trouble is breakage of the electron beam source 1. When the electron beam source 1 is damaged, the horizontal alignment mechanism pairs are first dismounted, and the second shield electrodes 13 and the molded electrode unit 16 are removed at the same time. After breaking the vacuum, the damaged electron beam source 1 is replaced by a new one. In this case, it is unnecessary to dismount the acceleration electrodes 11. However, when undesirable high voltage discharge occurs continuously in the vacuum, it is necessary to dismount the acceleration electrodes 11 too and to take a required counter-measure to deal with such serious trouble.

Thus, by merely molding the outer electrodes only into the molded electrode unit, the work required for disassembling and re-assembling the electron gun is greatly simplified, and the possibility of impairing the electrodes is minimized, so that the magnetic shielding capability can be further improved. It is needless to mention that, when the electron gun includes many acceleration stages, division of the molded electrode unit into a plurality of sub-units can exhibit the same effect.

Figure 6:
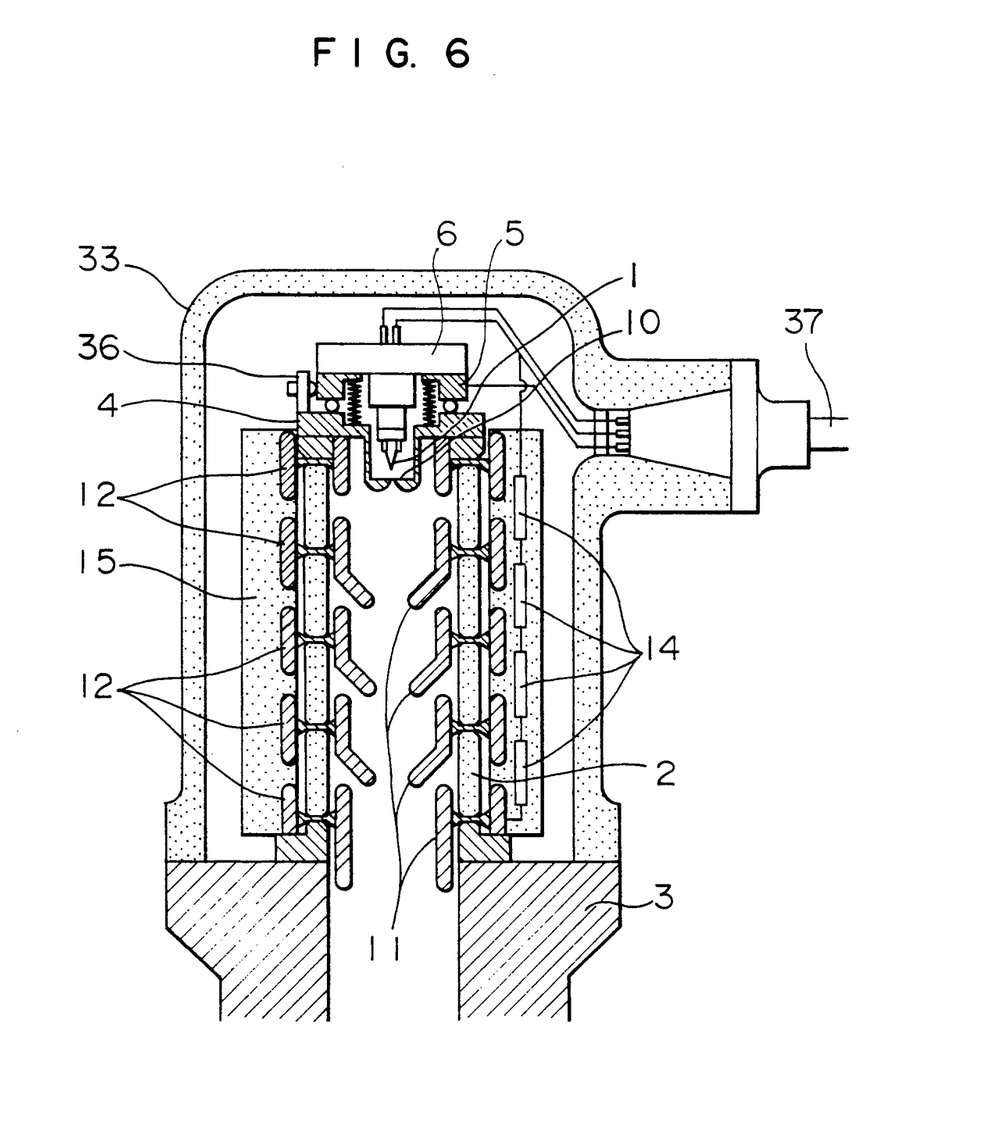
FIG. 6 schematically shows application of a fourth embodiment of the present invention to a field emission type electron gun.

A fourth embodiment of the present invention will now be described with reference to FIG. 6. This fourth embodiment is a simplified version of the electron gun shown in FIG. 4, and the second shield electrode and the components including the rotation transmission or drive mechanisms, the links and the upper gearings are eliminated. In this fourth embodiment, the axial alignment of the electron beam source 1 is manually done by manually rotating the feed screw type actuators 36 after removing the insulating housing 33. In the electron gun structure shown in FIG. 6, the electron beam source 1 cannot be moved while applying the high voltage. Because of the absence of the second shield electrodes, the magnetic shielding capability is lower than that of the electron gun shown in FIG. 4. In spite of the absence of the second shield electrodes, however, the magnetic shielding capability and voltage insulation effect of the electron gun shown in FIG. 6 is better than that of a conventional electron gun, and, when the number of required acceleration stages is not so large, the electron gun can be sufficiently put into practical use. Except for the absence of the second shield electrodes, and the other differences previously noted the embodiment shown in FIG. 6 is entirely the same as the embodiment shown in FIG. 4, and the work required for disassembling and re-assembling the electron gun can also be simplified.

Figure 7:
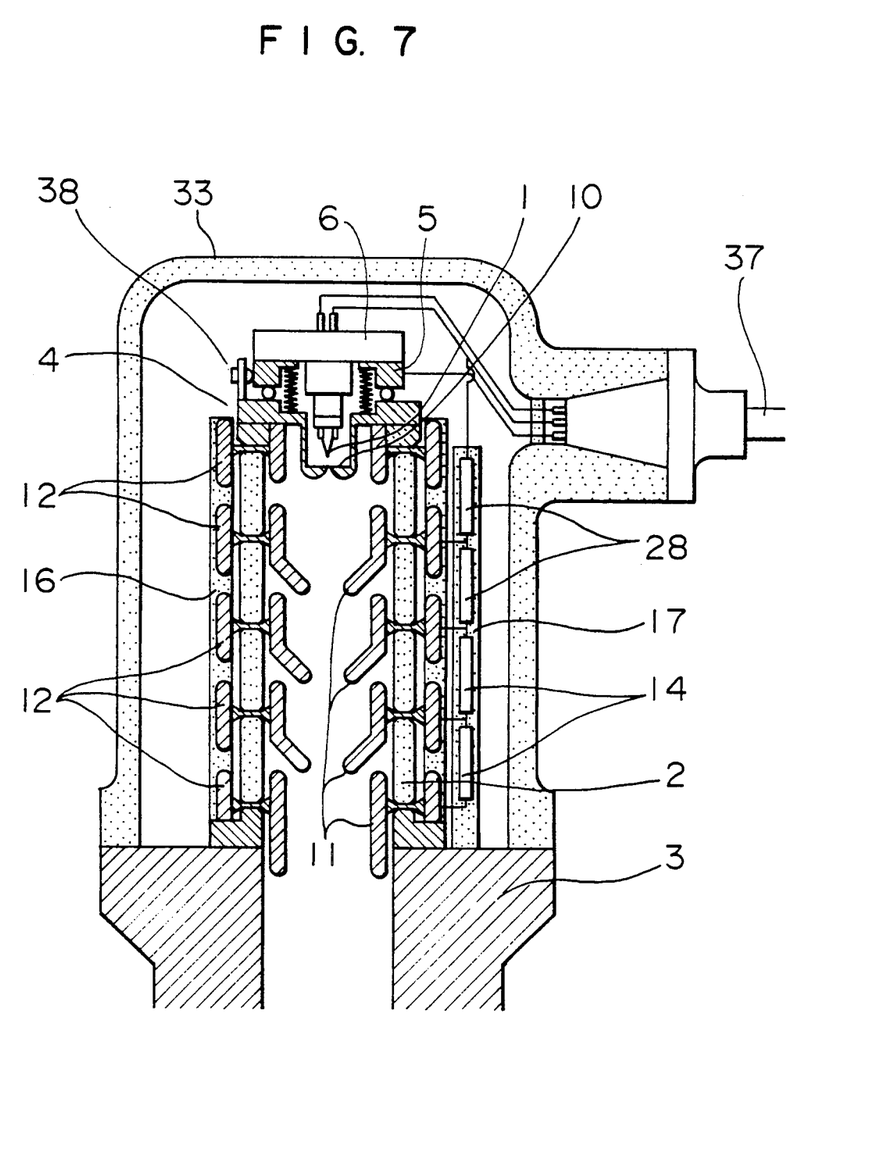
FIG. 7 schematically shows application of a fifth embodiment of the present invention to a field emission type electron gun.

A fifth embodiment of the present invention will now be described with reference to FIG. 7. This fifth embodiment is basically the same as the embodiment shown in FIG. 5 but differs from the latter in that the dividing resistors 28 are molded separately from the shield electrodes 12 into a molded resistor unit 17. Because of this separate molding of the dividing resistors 28, the dividing resistor 28 in each stage must be electrically connected to the associated shield electrode 12. Thus, although this fifth embodiment is somewhat inferior to the embodiments shown in FIGS. 4 and 6 from the aspect of assembling, it has such a merit that, when any one of the molded resistor unit and the molded electrode unit is damaged, the molded resistor unit and/or the molded electrode unit can be replaced independently of each other.

Figure 8:
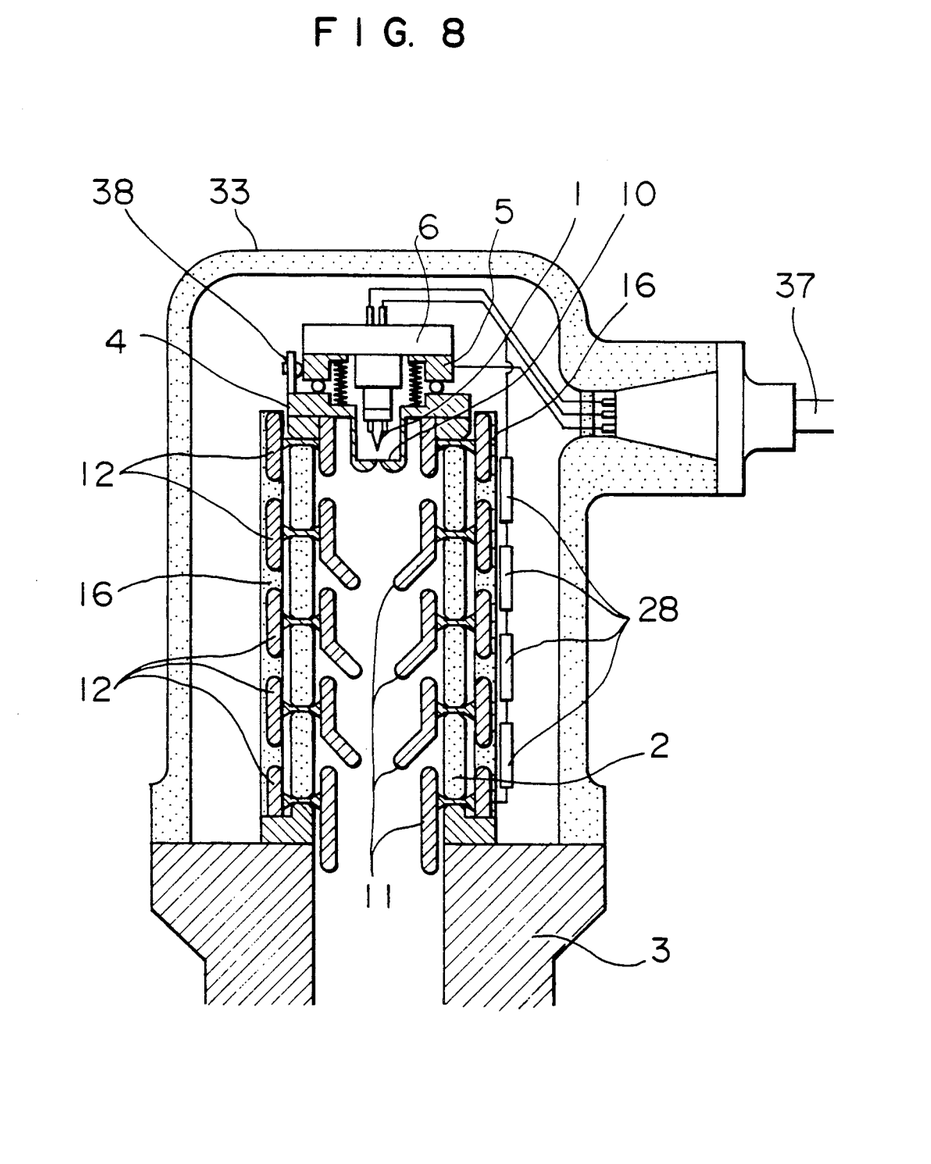
FIG. 8 schematically shows application of a sixth embodiment of the present invention to a field emission type electron gun.

A sixth embodiment of the present invention will now be described with reference to FIG. 8. This sixth embodiment differs from the embodiment shown in FIG. 7 in that the dividing resistors 28 are not molded into a molded resistor unit but are electrically connected to the molded electrode unit 16 in a conventional manner. Although this sixth embodiment is further inferior to the embodiment shown in FIG. 7 from the aspect of assembling, the illustrated arrangement is convenient to deal with the case where any one of the dividing resistors is damaged or the case where the voltage division ratio is to be changed so as to change the function of the optical system of the electron gun. The dividing resistor arrangement in this sixth embodiment may be incorporated in the embodiment shown in FIG. 7. That is, the basic voltage division ratio may be determined by the molded resistor unit, and discrete auxiliary dividing resistors may be additionally provided so as to adjust the voltage division ratio.

Figure 9:
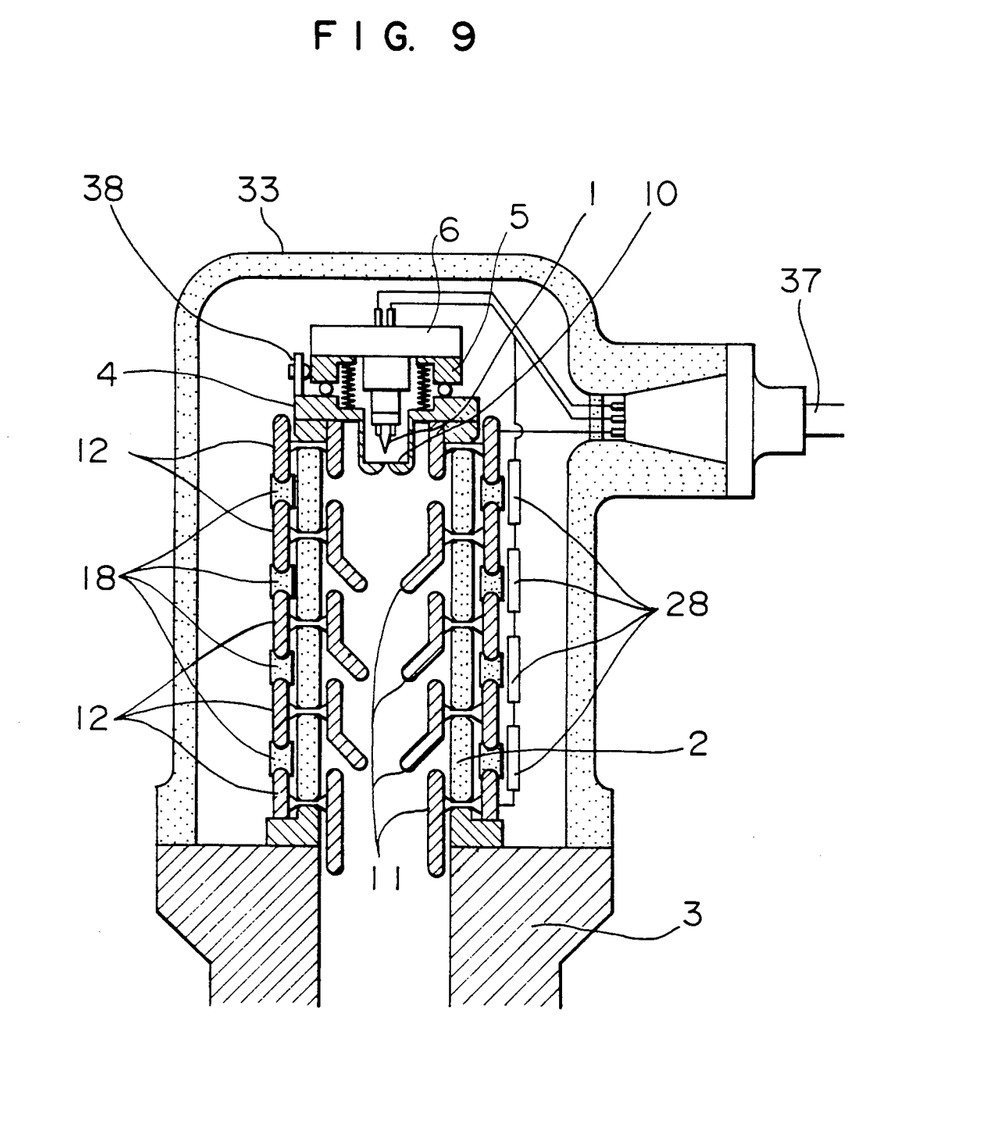
FIG. 9 schematically shows application of a seventh embodiment of the present invention to a field emission type electron gun.

A seventh embodiment will now be described with reference to FIG. 9. This seventh embodiment is a further simplified version of the embodiment shown in FIG. 8. Referring to FIG. 9, instead of molding the entirety of the shield electrodes 12 into the molded electrode unit, the vertically adjacent shield electrodes 12 are molded together by the epoxy resin at their confronting ends only or a spacer of an electrical insulator is inserted between the confronting ends of the vertically adjacent shield electrodes 12, so that an electrical insulator piece 18 is interposed between those shield electrodes 12. In the arrangement shown in FIG. 9 too, the spacing between the shield electrodes 12 can be narrowed thereby improving the magnetic shielding effect. Further, depending on the state of the interface between the shield electrodes and the interposed electrical insulator piece, they may be molded with the shield electrodes into an integral unit.

It will be understood from the foregoing detailed description that, in the charged particle beam generating apparatus of the multi-stage acceleration type according to the present invention, not only the possibility of occurrence of undesirable high voltage discharge between the electrodes can be minimized, but also the magnetic shield effect can be improved when the present invention is applied to the electron gun. Further, when the electrodes are molded by insulating material, both voltage insulation effect and magnetic shield effect can be improved. In this case, mirror-surface polishing of the confronting ends of the shield electrodes is utterly unnecessary. Therefore, the costs of parts can be reduced, and the work efficiencies of disassembling, re-assembling and adjusting the apparatus can be greatly improved. Further, application of the present invention to an electron microscope can greatly improve the magnetic shielding effect.

While the foregoing description refers to an electron gun of field emission type by way of example, it is apparent that the present invention is similarly effectively applicable to any one of other charged particle beam generating apparatuses including a conventional electron gun of thermionic emission type and an ion source.

We claim:

1. A charged particle beam generating apparatus of multi-stage acceleration type comprising:
   a source of a charged particle beam;
   a multi-stage acceleration tube having a plurality of acceleration electrodes arranged in cascade over a plurality of stages thereinside so as to accelerate the charged particle beam generated from said charged particle beam source;
   a plurality of first shield electrodes disposed in one-to-one concentrical relation with respect to the plurality of acceleration electrodes on the radially outer side of said multi-stage acceleration tube over the plural stages, said plurality of first shield electrodes being applied with the same potentials as those of the associated ones of said acceleration electrodes, respectively;
   a plurality of second shield electrodes disposed in one-to-one concentrical relation with respect to the plurality of first shield electrodes on the radially outer side of said first shield electrodes over the plural stages, said second shield electrodes being applied with the same potentials as those of the associated ones of said acceleration electrodes respectively; and
   a plurality of dividing resistors disposed between said first shield electrodes and said second shield electrodes and arranged to define predetermined potentials applied to said acceleration electrodes.

2. A charged particle beam generating apparatus of multi-stage acceleration type according to claim 1, further comprising a plurality of horizontal alignment means disposed between said first shield electrodes and said second shield electrodes for moving said charged particle beam source in a horizontal plane.

3. A charged particle beam generating apparatus of multi-stage acceleration type according to claim 2, wherein each of said horizontal alignment means includes at least one link having a plurality of insulator members, the number of insulator members corresponding to the number of acceleration stages, alternating with a plurality of conductor members, each of said conductor members being electrically connected to at least one of the first shield electrode and the second shield electrode disposed in the corresponding acceleration stage.

4. A charged particle beam generating apparatus of multi-stage acceleration type comprising:
   a source of an electron beam;
   a field emission electrode for causing field emission of the electron beam from said electron beam source;
   a multi-stage acceleration tube having a plurality of acceleration electrodes arranged in cascade over a plurality of stages thereinside so as to accelerate the electron beam generated from said electron beam source;
   a plurality of first shield electrodes disposed in one-to-one concentrical relation with respect to the plurality of acceleration electrodes on the radially outer side of said multi-stage acceleration tube over the plural stages, said plurality of first shield electrodes being applied with the same potentials as those of the associated ones of said acceleration electrodes respectively;
   a plurality of second shield electrodes disposed in one-to-one concentrical relation with respect to said plurality of first shield electrodes on the radially outer side of said first shield electrodes over the plural stages, said plurality of second shield electrodes being applied with the same potentials as those of the associated ones of said acceleration electrodes respectively;
   a plurality of dividing resistors disposed between said first shield electrodes and said second shield electrodes and arranged to define predetermined potentials applied to said acceleration electrodes; and
   a plurality of horizontal alignment means disposed between said first shield electrodes and said second shield electrodes for moving said electron beam source in a horizontal plane.

5. A charged particle beam generating apparatus of multi-stage acceleration type according to claim 4, wherein each of said horizontal alignment means includes at least one link having a plurality of insulator members, the number of insulator members corresponding to the number of acceleration stages, alternating with a plurality of conductor members, each of said conductor members being electrically connected to at least one of the first shield electrode and the second shield electrode that are disposed in the corresponding acceleration stage.

6. A charged particle beam generating apparatus of multi-stage acceleration type according to claim 1, further comprising an electrical insulator molding mass at least partially encompassing said first shield electrodes, said second shield electrodes and said dividing resistors without contacting said multi-stage acceleration tube.

7. A charged particle beam generating apparatus of multi-stage acceleration type comprising:
   a source of a charged particle beam;
   a multi-stage acceleration tube having a plurality of acceleration electrodes arranged in cascade over a plurality of stages thereinside so as to accelerate the charged particle beam generated from said charged particle beam source;
   a plurality of outer shield electrodes disposed in one-to-one concentrical relation with respect to the plurality of acceleration electrodes on the radially outer side of said multi-stage acceleration tube over the plural stages, said plurality of outer shield electrodes being applied with the same potentials as those of the associated ones of said acceleration electrodes, respectively;
   a plurality of dividing resistors disposed between said multi-stage acceleration tube and said outer shield electrodes and arranged to define predetermined potentials applied to said acceleration electrodes; and
   electrical insulator molding material at least partially encompassing one of said outer shield electrodes and one of said dividing resistors without contacting said multi-stage acceleration tube.

8. A charged particle beam generating apparatus of multi-stage acceleration type according to claim 7, wherein said dividing resistors and said outer shield electrodes are integrally molded into a single block by said electrical insulator molding material.

9. A charged particle beam generating apparatus of multi-stage acceleration type according to claim 7, wherein said dividing resistors and said outer shield electrodes are separately molded into separate blocks by said electrical insulator molding material.

10. A charged particle beam generating apparatus of multi-stage acceleration type according to claim 7, wherein said outer shield electrodes are integrally molded into a single block by said electrical insulator molding material.

11. A charged particle beam generating apparatus of multi-stage acceleration type according to claim 7, wherein adjacent ones of said outer shield electrodes are operably spaced apart in opposing fashion, and wherein said electrical insulator molding material fills the spaces between opposing outer shield electrodes to substantially insulatingly contact said outer shield electrodes at opposing portions substantially without contacting non-opposing portions of said opposing outer shield electrodes.

12. A charged particle beam generating apparatus of multi-stage acceleration type according to claim 7, further comprising horizontal alignment means including a plurality of links disposed between said outer shield electrodes and said multi-stage acceleration tube for moving said charged particle beam source in a horizontal plane, and wherein said insulator mass is formed with a plurality of passages permitting extension of said links therethrough.

13. A charged particle beam generating apparatus of multi-stage acceleration type according to claim 11, further comprising horizontal alignment means disposed between said outer shield electrodes and said multi-stage acceleration tube for moving said charged particle beam source in a horizontal plane.

14. A charged particle beam generating apparatus of multi-stage acceleration type according to claim 12, wherein each of said links includes a plurality of insulator members, the number of insulator members corresponding to the number of acceleration stages, alternating with a plurality of conductor members, each of said conductor members being electrically connected to the outer shield electrode that is disposed in the corresponding acceleration stage.

15. A charged particle beam generating apparatus of multi-stage acceleration type according to claim 13, wherein said horizontal alignment means includes a plurality of links, each of said links having a plurality of insulator members, the number of insulator members corresponding to the number of acceleration stages, alternating with a plurality of conductor members, each of said conductor members being electrically connected to the outer shield electrode disposed in the corresponding acceleration stage.

16. A charged particle beam generating apparatus of multi-stage acceleration type as claimed in claim 4, further comprising an electrical insulator molding mass at least partially encompassing said first shield electrodes, said second shield electrodes and said dividing resistors.

17. A charged particle beam generating apparatus of multi-stage acceleration type as claimed in claim 8, further comprising horizontal alignment means including a plurality of links disposed between said outer shield electrodes and said multi-stage acceleration tube for moving said charged particle beam source in a horizontal plane, and wherein said electrical insulator molding mass is formed with a plurality of passages permitting extension of said links therethrough.

18. A charged particle beam generating apparatus of multi-stage acceleration type as claimed in claim 9, further comprising horizontal alignment means including a plurality of links disposed between said outer shield electrodes and said multi-stage acceleration tube for moving said charged particle beam source in a horizontal plane, and wherein said electrical insulator molding mass is formed with a plurality of passages permitting extension of said links therethrough.

19. A charged particle beam generating apparatus of multi-stage acceleration type as claimed in claim 10, further comprising horizontal alignment means including a plurality of links disposed between said outer shield electrodes and said multi-stage acceleration tube for moving said charged particle beam source in a horizontal plane, and wherein said electrical insulator molding mass is formed with a plurality of passages permitting extension of said links therethrough.

20. A charged particle beam generating apparatus of multi-stage acceleration type as claimed in claim 1, wherein the source of a charge particle beam is a field-emission type source.

21. A charged particle beam generating apparatus of multi-stage acceleration type as claimed in claim 1, wherein the source of a charged particle beam is a thermionic-emission type source.

22. A charged particle beam generating apparatus as claimed in claim 7, wherein the source of a charged particle beam is a field-emission type source.

23. A charged particle beam generating apparatus as claimed in claim 7, wherein the source of a charged particle beam is a thermionic-emission type source.

24. A charged particle beam generating apparatus as claimed in claim 1, wherein the charged particle beam generating apparatus of multi-stage acceleration type forms part of an electron microscope.

25. A charged particle beam generating apparatus as claimed in claim 4, wherein the charged particle beam generating apparatus of multi-stage acceleration type forms part of an electron microscope.

26. A charged particle beam generating apparatus as claimed in claim 7, wherein the charged particle beam generating apparatus of multi-stage acceleration type forms part of an electron microscope.

27. A charged particle beam generating apparatus as claimed in claim 6, wherein the electrical insulator molding mass includes an epoxy resin.

28. A charged particle beam generating apparatus as claimed in claim 7, wherein the electrical insulator molding material includes an epoxy resin.

29. A charged particle beam generating apparatus as claimed in claim 9, further comprising at least one auxiliary resistor disposed between said multi-stage acceleration tube and said molded divided resistor block, said at least one auxiliary resistor being arranged to apply predetermined potentials to said acceleration electrodes in conjunction with said plurality of dividing resistors.

30. A charged particle beam generating apparatus of multi-stage acceleration type, comprising:
a source of a charged particle beam;
a multi-stage acceleration tube defining a plurality of acceleration stages arranged in cascade thereinside to accelerate the charged particle beam generated from said charged particle beam source, each said stage including
an acceleration electrode;
a first shield electrode disposed in concentrical relation with respect to the acceleration electrode on the radially outer side of said multi-stage acceleration tube, said first shield electrode being applied with the same potential as the acceleration electrode of its stage; and
a second shield electrode disposed in concentrical relation with respect to the first shield electrode on the radially outer side of said first shield electrode, said second shield electrode being applied with the same potential as the acceleration electrode of its same stage; and
a plurality of dividing resistors disposed between the cascaded first shield electrodes and second shield electrodes and arranged to define predetermined potentials applied to said acceleration electrodes.

31. A charged particle beam generating apparatus of multi-stage acceleration type according to claim 30, further comprising a plurality of horizontal alignment means disposed between said first shield electrodes and said second shield electrodes for moving said charged particle beam source in a horizontal plane.

32. A charged particle beam generating apparatus of multi-stage acceleration type according to claim 31, wherein each of said horizontal alignment means includes at least one link having a plurality of insulator members, the number of insulator members corresponding to the number of acceleration stages, alternating with a plurality of conductor members, each of said conductor members being electrically connected to at least one of the first shield electrode and the second shield electrode that are disposed in the corresponding acceleration stage.

33. A charged particle beam generating apparatus of multi-stage acceleration type according to claim 30, further comprising an electrical insulator molding mass at least partially encompassing said first shield electrodes, said second shield electrodes and said dividing resistors without contacting said multi-stage acceleration tube.

* * * * *